(12) United States Patent
Lee (10) Patent No.: US 10,403,344 B2
(45) Date of Patent: Sep. 3, 2019

(54) SEMICONDUCTOR DEVICE FOR PREVENTING READ DISTURBANCE

(71) Applicant: SK hynix Inc., Gyeonggi-do (KR)

(72) Inventor: Kyo-Yun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/687,628

(22) Filed: Aug. 28, 2017

(65) Prior Publication Data

US 2018/0197590 A1 Jul. 12, 2018

(30) Foreign Application Priority Data

Jan. 10, 2017 (KR) .................. 10-2017-0003450

(51) Int. Cl.
| | | |
|---|---|---|
| *G11C 11/16* | (2006.01) | |
| *G11C 13/00* | (2006.01) | |
| *G11C 11/22* | (2006.01) | |

(52) U.S. Cl.
CPC ...... *G11C 11/1673* (2013.01); *G11C 11/1655* (2013.01); *G11C 11/1675* (2013.01); *G11C 11/1693* (2013.01); *G11C 11/2273* (2013.01); *G11C 13/004* (2013.01); *G11C 11/161* (2013.01); *G11C 2013/0045* (2013.01)

(58) Field of Classification Search
None
See application file for complete search history.

(56) References Cited

U.S. PATENT DOCUMENTS

| | | | |
|---|---|---|---|
| 9,299,410 B2 | 3/2016 | Sakai et al. | |
| 2009/0273961 A1* | 11/2009 | Ono .................. | G11C 7/18 365/51 |
| 2015/0055396 A1* | 2/2015 | Takahashi .......... | G11C 13/0069 365/148 |
| 2015/0070971 A1 | 3/2015 | Katayama et al. | |
| 2015/0228339 A1* | 8/2015 | Iwasaki ............. | G11C 13/0002 365/148 |

FOREIGN PATENT DOCUMENTS

KR 100822795 4/2008

* cited by examiner

*Primary Examiner* — James G Norman
(74) *Attorney, Agent, or Firm* — IP & T Group LLP (57) ABSTRACT

Disclosed is a semiconductor device, including a memory cell array including a plurality of memory cells, a read circuit suitable for generating read data corresponding to a read current flowing in a first direction through a selected memory cell of the plurality of memory cells, a reverse read control circuit suitable for generating a reverse read control signal corresponding to the read data, and a reverse current generation circuit suitable for generating a reverse current flowing in a second direction through the selected memory cell in response to the reverse read control signal.

19 Claims, 5 Drawing Sheets

SEMICONDUCTOR DEVICE FOR PREVENTING READ DISTURBANCE

CROSS-REFERENCE TO RELATED APPLICATION(S)

The present application claims priority of Korean Patent Application No. 10-2017-0003450, filed on Jan. 10, 2017, which is incorporated herein by reference in its entirety.

BACKGROUND

1. Field

Exemplary embodiments of the present invention relate to a semiconductor design technology and, more particularly, to a semiconductor device.

2. Description of the Related Art

Recent advances in electronic devices such as size reduction, reduced power consumption, enhanced performance, and diversification, require semiconductor memories that are capable of storing data in various electronic devices, including computers and mobile communication devices.

Significant research efforts have been targeted to semiconductor memories capable of storing data corresponding to different resistance states of a memory cell depending on a voltage or current applied thereto, such as resistive random access memory (RRAM), phase-change random access memory (PRAM), ferroelectric random access memory (FRAM), magnetic random access memory (MRAM) and E-fuse.

Generally, in a semiconductor memory, read disturbance may be generated when performing a read operation. The read disturbance refers to a phenomenon in which the data value (or logic value) of a corresponding memory cell is unintentionally changed due to structure characteristics and/or operating characteristics of the memory device when a read operation is performed.

To prevent a read disturbance, write back technology has been introduced into the semiconductor memory. The write back technology can prevent the read disturbance by additionally performing a write operation on a memory cell on which a read operation has been performed right after the read operation.

However, the write back technology typically requires greater current consumption than a read operation, and more operating time because it performs a write operation using a substantial write circuit. The write back technology may also exert a bad influence on the lifespan of a memory cell.

Accordingly, there is a need for an improved technology for substituting current write back technology.

SUMMARY

Various embodiments of the present invention are directed to a semiconductor device for preventing read disturbance when a read operation is performed.

Also, various embodiments are directed to a semiconductor device having more enhanced performance than the write back technology if read disturbance is to be prevented upon a read operation.

In an embodiment, a semiconductor device may include: a memory cell array including a plurality of memory cells; a read circuit suitable for generating read data corresponding to a read current flowing in a first direction through a selected memory cell of the plurality of memory cells; a reverse read control circuit suitable for generating a reverse read control signal corresponding to the read data; and a reverse current generation circuit suitable for generating a reverse current flowing in a second direction through the selected memory cell in response to the reverse read control signal.

The reverse read control circuit may be suitable for: activating the reverse read control signal based on the read data having a first data value; and deactivating the reverse read control signal based on the read data having a second data value.

The first data value may correspond to the read current flowing when the selected memory cell is a low resistance state, and the second data value may correspond to the read current flowing when the selected memory cell is a high resistance state.

The reverse read control circuit may include: a determination unit suitable for determining a resistance state of the selected memory cell based on a read enable signal and the read data; and a control unit suitable for generating the reverse read control signal based on the determined resistance state.

The reverse current generation circuit may be suitable for: generating the reverse current in response to the reverse read control signal which is activated, and not generating the reverse current in response to the reverse read control signal which is deactivated.

The reverse current generation circuit may include: a reverse current source unit suitable for sourcing the reverse current in response to the reverse read control signal; and a reverse current sink unit suitable for sinking the reverse current in response to the reverse read control signal.

The reverse current generation circuit may further include a clamping unit suitable for limiting the reverse current.

Each of the plurality of memory cells may include a variable resistance element having a resistance state varied depending on a direction of the read current.

The semiconductor device may further include: a write circuit suitable for generating a write current flowing in a direction corresponding to write data through a selected memory cell of the plurality of memory cells.

In an embodiment, a semiconductor device may include: a global bit line; a global source line; a plurality of bit lines coupled to the global bit line; a plurality of source lines coupled to the global source line; a memory cell array including a plurality of memory cells arranged in a row direction and column direction, wherein memory cells belonging to the plurality of memory cells and being aligned in the row direction are selected by a plurality of word lines and memory cells belonging to the plurality of memory cells and being aligned in the column direction are selected by the plurality of bit lines and the plurality of source lines; a read circuit coupled to the global bit line, suitable for generating read data corresponding to a read current flowing in a first direction through a selected memory cell of the plurality of memory cells; a reverse read control circuit suitable for generating a reverse read control signal corresponding to the read data; and a reverse current generation circuit coupled to the global bit line and the global source line in response to the reverse read control signal, suitable for generating a reverse current flowing in a second direction through the selected memory cell.

The reverse read control circuit may be suitable for: activating the reverse read control signal based on the read data having a first data value; and deactivating the reverse read control signal based on the read data having a second data value.

The first data value may correspond to the read current flowing when the selected memory cell is a low resistance state, and the second data value may correspond to the read current flowing when the selected memory cell is a high resistance state.

The reverse read control circuit may include: a determination unit suitable for determining a resistance state of the selected memory cell based on a read enable signal and the read data; and a control unit suitable for generating the reverse read control signal based on the determined resistance state.

The reverse current generation circuit may be suitable for: generating the reverse current in response to the reverse read control signal which is activated, and not generating the reverse current in response to the reverse read control signal which is deactivated.

The reverse current generation circuit may include: a reverse current sink unit suitable for sinking the reverse current from the global bit line to a low voltage stage in response to the reverse read control signal; and a reverse current source unit suitable for sourcing the reverse current from a high voltage stage to the global source line in response to an inverted signal of the reverse read control signal.

The reverse current generation circuit may further include a clamp unit suitable for being coupled between the reverse current source unit and the global source line and for limiting the reverse current.

The read circuit may include: a sense amplification unit suitable for generating the read data based on the read current and a reference current; a read current source unit suitable for sourcing the read current from the sense amplification unit to the global bit line in response to a read enable signal; and a read current sink unit suitable for sinking the read current from the global source line to the low voltage stage in response to the read enable signal.

The read circuit further may include a clamp unit suitable for being coupled between the read current source unit and the global bit line and limiting the read current.

Each of the plurality of memory cells may include a variable resistance element having a resistance state varied depending on a direction of the read current.

The semiconductor device may further include: a write circuit coupled between the global bit line and the global source line, suitable for generating a write current flowing in a direction corresponding to write data through a selected memory cell of the plurality of memory cells.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single layer or a multi-layer that exhibits the variable resistance characteristic and includes a material used in a resistive random access memory (RRAM), phase-change RAM (PRAM), spin transfer torque magnetic RAM (STTRAM), magnetoresistive RAM (MRAM) or ferroelectric RAM (FRAM), e.g., may include a ferromagnetic material, a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO:SrTiO) and/or a praseodymium calcium manganese oxide (PCMO:PrCaMnO).

Moreover, the variable resistance element may include a phase change material. The phase change material may include a chalcogenide material such as germanium-antimony-tellurium (GST: GeSbTe). The variable resistance element switches between different resistance states by changing a crystal state or an amorphous state using a heat.

The variable resistance element may include two magnetic layers and a tunnel barrier layer interposed between the two magnetic layers. The magnetic layer may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to a magnetization direction of the magnetic layer. For example, the variable resistance element may be in a low resistance state when a magnetization direction of two magnetic layers is parallel, and be in a high resistance state when a magnetization direction of two magnetic layers is anti-parallel.

Figure 1:
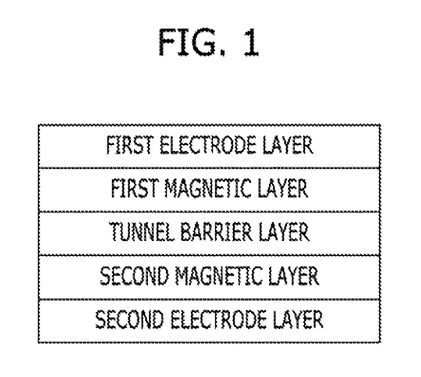
FIG. 1 is a diagram showing an example of a magnetic tunnel junction (MTJ) as one of structures in which a tunnel barrier layer is interposed between two magnetic layers.

FIG. 1 is a diagram showing an example of a magnetic tunnel junction (MTJ) as one of structures in which a tunnel barrier layer is interposed between two magnetic layers.

As shown in FIG. 1, an MTJ includes a first electrode layer as a top electrode, a second electrode layer as a bottom electrode, a first magnetic layer and a second magnetic layer as a pair of magnetic layers, and a tunnel barrier layer which is formed between the pair of magnetic layers.

The first magnetic layer may be a pinned magnetic layer of which magnetization direction may be changed depending on the direction of the current applied to the MTJ, and the second magnetic layer may be a free magnetic layer of which magnetization direction is pinned.

Such an MTJ is changed in its resistance value depending on the direction of the current, and records data "0" or "1."

Figure 2A:
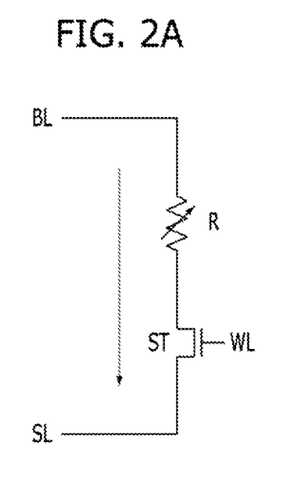
FIGS. 2A and 2B are diagrams explaining the storing of data in a variable resistance element.
Figure 2B:
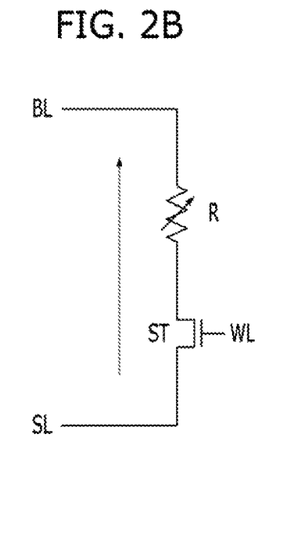

FIGS. 2A and 2B are views explaining a principle of storing data in a variable resistance element R. The variable resistance element R may be the MTJ described above with reference to FIG. 1.

First, FIG. 2A is a diagram explaining a principle of recording data with a high logic value in the variable resistance element R. In order to select the variable resistance element R to store data, a word line WL electrically coupled to the variable resistance element R is activated, and a transistor ST is turned on. As a current flows from one end toward the other end (in the direction indicated by the arrow), that is, from the first electrode layer as the top electrode of the MTJ shown in FIG. 1 to the second electrode layer as the bottom electrode, the magnetization direction of the first magnetic layer as the pinned magnetic layer and the magnetization direction of the second magnetic layer as the free magnetic layer become anti-parallel to each other, and the variable resistance element R has a high resistance state. When the variable resistance element R is the high resistance state, it is defined that 'high' data is stored in the variable resistance element R.

Next, FIG. 2B is a diagram explaining a principle of recording data with a low logic value in the variable resistance element R. In a similar manner, the word line WL electrically coupled to the variable resistance element R is activated, and the transistor ST is turned on. As a current flows from the other end toward one end (in the direction indicated by the arrow), that is, from the second electrode layer to the first electrode layer, the magnetization direction of the first magnetic layer and the magnetization direction of the second magnetic layer become parallel to each other, and the variable resistance element R has a low resistance state. When the variable resistance element R is the low resistance state, it is defined that 'low' data is stored in the variable resistance element R.

Figure 3:
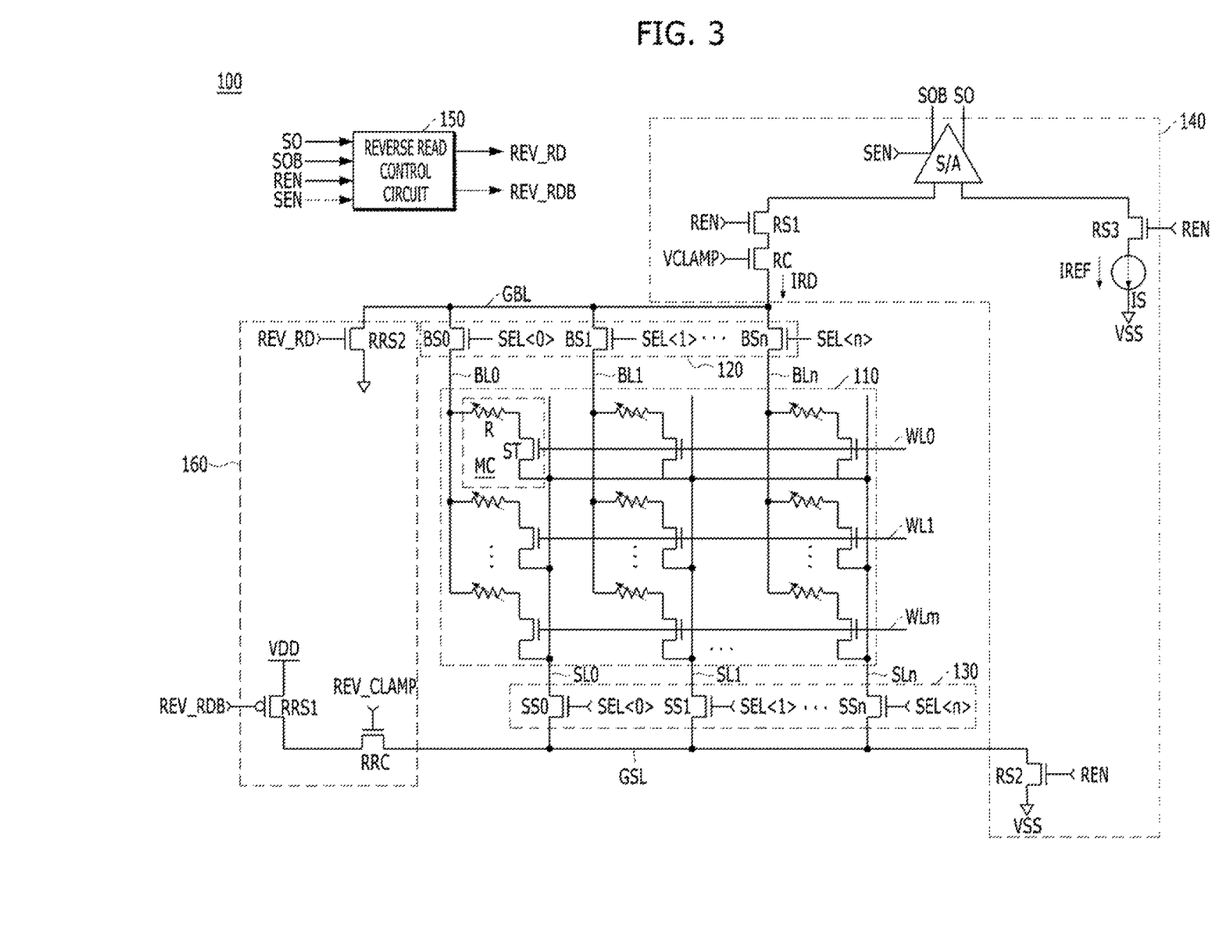
FIG. 3 is a diagram showing a semiconductor device in accordance with an embodiment of the present invention.

FIG. 3 is a diagram showing a semiconductor device 100 in accordance with an embodiment of the present invention.

Referring to FIG. 3, the semiconductor device 100 may include a memory cell array 110, a bit line selection circuit 120, a source line selection circuit 130, a read circuit 140, a reverse read control circuit 150 and a reverse current generation circuit 160.

The memory cell array 110 may include a plurality of memory cells MC arranged in a row direction and a column direction. Each of the plurality of memory cells MC may include a variable resistance element R and a transistor ST. A plurality of memory cell column groups may be coupled to a plurality of bit lines BL0~BLn and a plurality of source lines SL0~SLn, respectively. Each memory cell column group may include a plurality of memory cells MC arranged in the column direction. For example, a first memory cell column group including a plurality of memory cells MC aligned in a first column may be coupled to the first bit line BL0 and the first source line SL0. Each of the memory cells included in the first memory cell column group may have one end coupled to the first bit line BL0 and may have the other end coupled to the first source line SL0. A plurality of memory cell row groups, each including a plurality of memory cells MC arranged in the row direction, may be coupled to a plurality of word lines WL0~WLm, respectively. For example, a first memory cell row group including a plurality of memory cells MC aligned in a first row may be coupled to the first word line WL0. At least one of the plurality of memory cells may be selected by a selected bit line BL# of the plurality of bit lines BL0~BLn, a selected source line SL# of the plurality of source lines SL0~SLn and an activated word line WL# of the plurality of word lines WL0~WLm.

The bit line selection circuit 120 may select and couple any one of the plurality of bit lines BL0~BLn to a global bit line GBL in response to a selection signal among the plurality of selection signals SEL<0:n>. For example, the bit line selection circuit 120 may include a plurality of bit line selection units BS0~BSn corresponding to the plurality of bit lines and to the plurality of selection signals SEL<0:n>, respectively.

The source line selection circuit 130 may select and couple any one of the plurality of source lines SL0~SLn to a global source line GSL together in response to a selection signal among the plurality of selection signals SEL<0:n>. For example, the source line selection circuit 130 may include a plurality of source line selection units SS0~SSn corresponding to the plurality of source lines and to the plurality of selection signals SEL<0:n>, respectively.

The read circuit 140 may generate differential read data SO and SOB, corresponding to a read current IRD that flows in one direction through a selected memory cell of the plurality of memory cells MC, in response to a read enable signal REN. For example, the read circuit 140 may compare a read current IRD with a reference current IREF, and may generate differential read data SO and SOB corresponding to the resistance state of a selected memory cell based on a result of the comparison by a sense amplification unit S/A. If, as the result of the comparison, it is determined that the read current IRD is higher than the reference current IREF, the read circuit 140 may generate differential read data SO and SOB corresponding to a low resistance state. In this case, the positive read data SO of the differential read data SO and SOB may have a first data value (or a first logic value), and the negative read data SOB of the differential read data SO and SOB may have a second data value (or a second logic value). In contrast, if, as the result of the comparison, it is determined that the read current IRD is lower than the reference current IREF, the read circuit 140 may generate differential read data SO and SOB corresponding to a high resistance state. In this case, the positive read data SO of the differential read data SO and SOB may have the second data value (or the second logic value), and the negative read data SOB of the differential read data SO and SOB may have the first data value (or the first logic value).

For example, the read circuit 140 may include the sense amplification unit S/A, a read current source unit RS1, a clamp unit RC, a read current sink unit RS2, a reference current generation unit IS and a reference current source unit RS3. The sense amplification unit S/A may be enabled in response to a sense enable signal SEN, and may generate differential read data SO and SOB based on the comparison of a read current IRD and a reference current IREF. For example, the sense amplification unit S/A may include a differential amplifier. The read current source unit RS1 may source the read current IRD from the sense amplification unit S/A to the global bit line GBL in response to the read enable signal REN. The clamp unit RC may be coupled between the read current source unit RS1 and the global bit line GBL, and may limit a maximum amount of current of a read current IRD in response to a VCLAMP. The read current sink unit RS2 may sink the read current IRD from the global source line GSL to a low voltage stage VSS (or ground voltage stage) in response to the read enable signal REN. The reference current generation unit IS may generate a reference current IS. The reference current source unit RS3 may source a reference current IREF from the sense amplification unit S/A to the reference current generation unit IS in response to the read enable signal REN.

The reverse read control circuit 150 may generate a reverse read control signal REV_RD and an inverted reverse read control signal REV_RDB, corresponding to a data value of differential read data SO and SOB, in response to the read enable signal REN. Alternatively, the reverse read control circuit 150 may generate a reverse read control signal REV_RD and an inverted reverse read control signal REV_RDB, corresponding to a data value of differential read data SO and SOB, in response to the read enable signal REN and the sense enable signal SEN. The inverted reverse read control signal REV_RDB may be an inverted signal of the reverse read control signal REV_RD. For example, the reverse read control circuit 150 may activate the reverse read control signal REV_RD and the inverted reverse read control signal REV_RDB based on differential read data SO and SOB when the selected memory cell is at the low resistance state. In contrast, the reverse read control circuit 150 may deactivate the reverse read control signal REV_RD and the inverted reverse read control signal REV_RDB based on differential read data SO and SOB when the selected memory cell is at the high resistance state.

The reverse current generation circuit 160 may be coupled to the global bit line GBL and the global source line GSL in response to the reverse read control signal REV_RD and the inverted reverse read control signal REV_RDB, and may generate a reverse current in the other direction through the selected memory cell. For example, the reverse current generation circuit 160 may generate the reverse current in response to an activated reverse read control signal REV_RD and a corresponding inverted reverse read control signal REV_RDB. In contrast, the reverse current generation circuit 160 may not generate the reverse current in response to a deactivated reverse read control signal REV_RD and a corresponding inverted reverse read control signal REV_RDB.

For example, the reverse current generation circuit 160 may include a reverse current source unit RRS1, a clamp unit RRC and a reverse current sink unit RRS2. The reverse current source unit RRS1 may source the reverse current from a high voltage stage VDD (or power supply voltage stage) to the global source line GSL in response to an inverted reverse read control signal REV_RDB. The reverse current source unit RRS1 may operate in response to a reverse read control signal REV_RD depending on the design. The clamp unit RRC may be coupled between the reverse current source unit RRS1 and the global source line GSL, and may limit the maximum amount of current of a reverse current in response to a clamp bias signal for reverse read REV_CLAMP. The clamp bias signal for reverse read REV_CLAMP may have a voltage level identical with or similar to the clamp bias read signal VCLAMP. The reverse current sink unit RRS2 may sink the reverse current from the global bit line GBL to the low voltage stage VSS in response to a reverse read control signal REV_RD. The reverse current may be defined by the pulse width of the reverse read control signal REV_RD, the inverted reverse read control signal REV_RDB and a voltage level of the clamp bias signal for reverse read REV_CLAMP. For example, the pulse width of the reverse read control signal REV_RD, the inverted reverse read control signal REV_RDB and a voltage level of the clamp bias signal for reverse read REV_CLAMP may be set so that the reverse current has the amount of current identical with or similar to a read current IRD when the selected memory cell is at the low resistance state.

Although not shown, the semiconductor device 100 may further include a write circuit. The write circuit may be coupled between the global bit line GBL and the global source line GSL, and may generate a write current that flows in a direction corresponding to write data through a selected memory cell of the plurality of memory cells MC in response to a write enable signal. The write circuit may be a circuit that substantially performs the data storage operations shown in FIGS. 2A and 2B. It is to be noted that the write circuit and the reverse current generation circuit 160 are separate elements.

Figure 4:
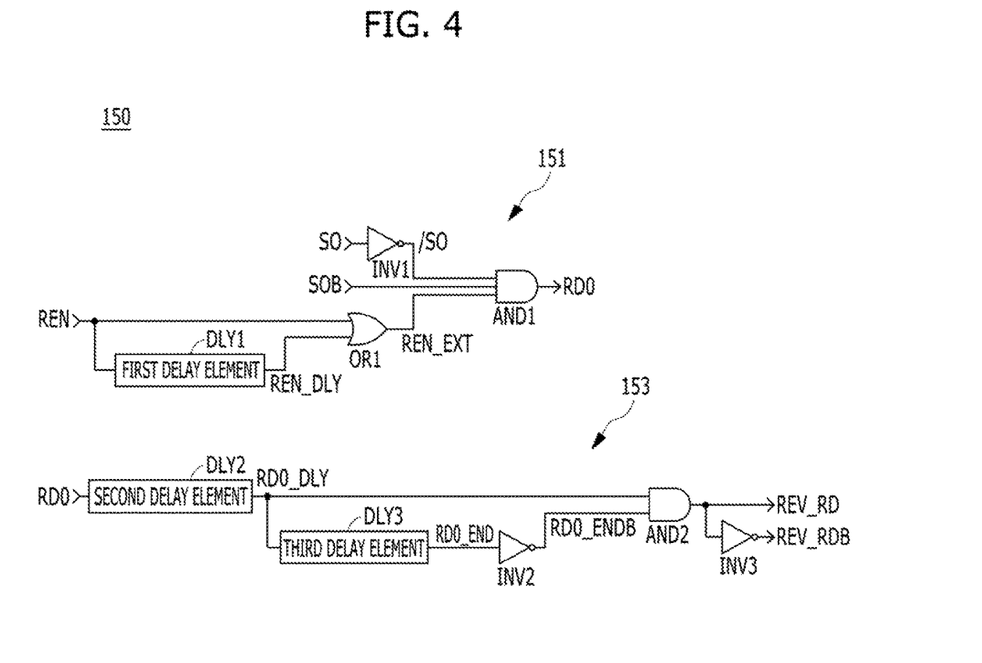
FIG. 4 is a circuit diagram showing an example of a reverse read control circuit shown in FIG. 3.

FIG. 4 is a circuit diagram showing an example of a reverse read control circuit in accordance with an embodiment of the present invention, for example, the reverse read control circuit 150 shown in FIG. 3.

Referring to FIG. 4, the reverse read control circuit 150 may include a determination unit 151 and a control unit 153.

The determination unit 151 may determine a resistance state of the selected memory cell based on the read enable signal REN and differential read data SO and SOB, and may generate a determination signal RD0 corresponding to a result of the determination. For example, the determination unit 151 may maintain the deactivation state of the determination signal RD0 when the selected memory cell is at the high resistance state. In contrast, the determination unit 151 may activate the determination signal RD0 when the selected memory cell is at the low resistance state.

The determination unit 151 may include a first delay element DLY1, a first OR gate OR1, a first inverter INV1 and a first AND gate AND1. The first delay element DLY1 may generate a first delay signal REN_DLY by delaying the read enable signal REN by a first delay time D1. The first delay time D1 may be set by taking into consideration a pulse width of the read enable signal REN and a point of time at which the sense amplification unit S/A is disabled. The first OR gate OR1 may generate a first logic signal REN_EXT by performing an OR operation on the read enable signal REN and the first delay signal REN_DLY. The first inverter INV1 may generate a second logic signal /SO by inverting positive read data SO. The first AND gate AND1 may generate the determination signal RD0 by performing an AND operation on the second logic signal/SO, the negative read data SOB and the first logic signal REN_EXT.

The control unit 153 may generate the reverse read control signal REV_RD and the inverted reverse read control signal REV_RDB in response to the determination signal RD0. For example, the control unit 153 may maintain the deactivation state of the reverse read control signal REV_RD and the inverted reverse read control signal REV_RDB in response to a deactivated determination signal RD0. In contrast, the control unit 153 may activate the reverse read control signal REV_RD and the inverted reverse read control signal REV_RDB similar to a point of time at which the sense amplification unit S/A is disabled in response to the activated determination signal RD0.

The control unit 153 may include a second delay element DLY2, a third delay element DLY3, a second inverter INV2, a second AND gate AND2 and a third inverter INV3. The second delay element DLY2 may generate a second delay signal RD0_DLY by delaying the determination signal RD0 by a second delay time D2. The second delay time D2 may be set by taking into consideration a point of time at which the sense amplification unit S/A is disabled. The third delay element DLY3 may generate a third delay signal RD0_END by delaying the second delay signal RD0_DLY by a third delay time D3. The third delay time D3 may be set by taking into consideration a point of time at which the sense enable signal SEN is activated from a point of time at which the read enable signal REN is activated. The second inverter INV2 may generate a third logic signal RD0_ENDB by inverting the third delay signal RD0_END. The second AND gate AND2 may generate the reverse read control signal REV_RD by performing an AND operation on the third logic signal RD0_ENDB and the second delay signal RD0_DLY. The third inverter INV3 may generate the inverted reverse read control signal REV_RDB by inverting the reverse read control signal REV_RD.

Figure 5:
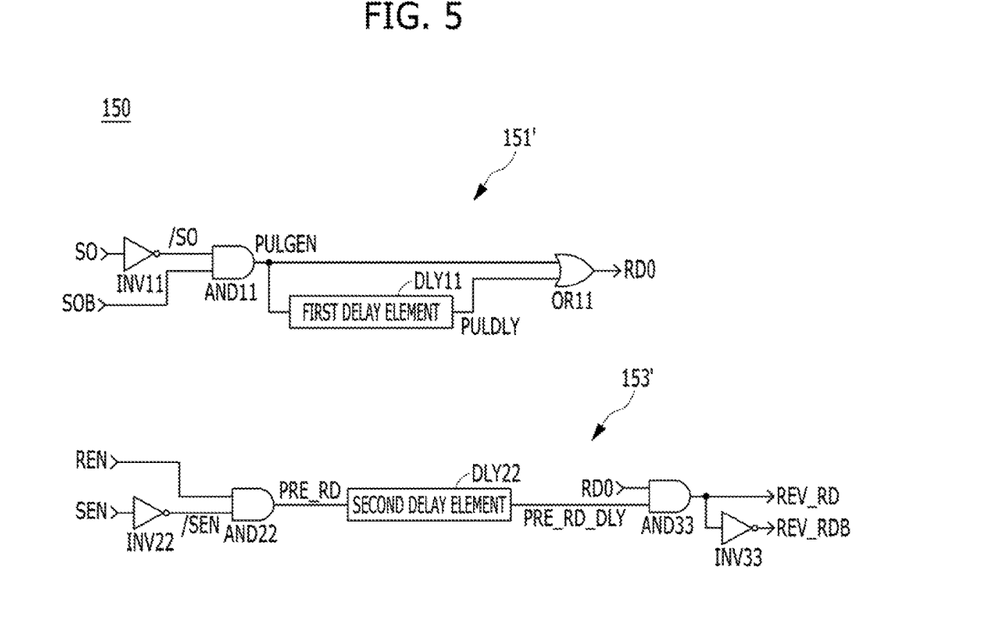
FIG. 5 is a circuit diagram showing another example of a reverse read control circuit shown in FIG. 3.

FIG. 5 is a circuit diagram showing another example of a reverse read control circuit in accordance with an embodiment of the present invention, for example, the reverse read control circuit 150 shown in FIG. 3.

Referring to FIG. 5, the reverse read control circuit 150 may include a determination unit 151' and a control unit 153'.

The determination unit 151' may determine a resistance state of the selected memory cell based on differential read data SO and SOB, and may generate a determination signal RD0 corresponding to a result of the determination. For example, the determination unit 151' may maintain the deactivation state of the determination signal RD0 when the selected memory cell is at the high resistance state. In contrast, the determination unit 151' may activate the determination signal RD0 when the selected memory cell is at the low resistance state.

The determination unit 151' may include a first inverter INV11, a first AND gate AND11, a first delay element DLY11 and a first OR gate OR1. The first inverter INV11 may generate a first logic signal/SO by inverting positive read data SO. The first AND gate AND11 may generate a second logic signal PULGEN by performing an AND operation on the first logic signal/SO and the inverted (or negative) read data SOB. The first delay element DLY11 may generate a third logic signal PULDLY by delaying the second logic signal PULGEN by a first delay time D11. The first delay time D11 may correspond to the aforementioned second delay time D2. The first OR gate OR11 may generate the determination signal RD0 by performing an OR operation on the second logic signal PULGEN and the third logic signal PULDLY.

The control unit 153' may generate the reverse read control signal REV_RD and the inverted reverse read control signal REV_RDB in response to the determination signal RD0. For example, the control unit 153 may maintain the deactivation state of the reverse read control signal REV_RD and the inverted reverse read control signal REV_RDB in response to a deactivated determination signal RD0. In contrast, the control unit 153' may activate the reverse read control signal REV_RD and the inverted reverse read control signal REV_RDB similar to a point of time at which the sense amplification unit S/A is disabled in response to an activated determination signal RD0.

The control unit 153' may include a second inverter INV22, a second AND gate AND22, a second delay element DLY22, a third AND gate AND33 and a third inverter INV33. The second inverter INV22 may generate a fourth logic signal/SEN by inverting the sense enable signal SEN. The second AND gate AND22 may generate a fifth logic signal PRE_RD by performing an AND operation on the fourth logic signal/SEN and the read enable signal REN. The second delay element DLY22 may generate a sixth logic signal PRE_RD_DLY by delaying the fifth logic signal PRE_RD by a second delay time D22. The second delay time D22 may correspond to the total time D1+D2 of the aforementioned first delay time D1 and second delay time D2. The third AND gate AND33 may generate the reverse read control signal REV_RD by performing an AND operation on the sixth logic signal PRE_RD_DLY and the determination signal RD0. The third inverter INV33 may generate the inverted reverse read control signal REV_RDB by inverting the reverse read control signal REV_RD.

A read operation of the semiconductor device 100 having such a configuration is described below with reference to FIGS. 6 to 9.

First, a read operation of the semiconductor device 100 including the reverse read control circuit 150 of FIG. 4 is described below with reference to FIGS. 6 and 7.

Figure 6:
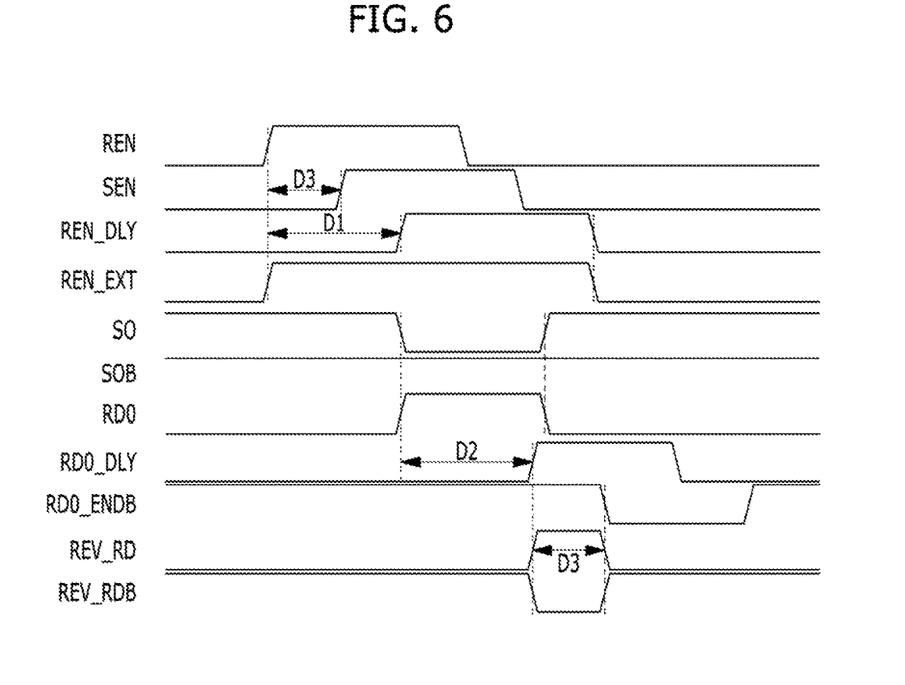
FIGS. 6 to 9 are timing diagrams for illustrating read operations of a semiconductor device shown in FIG. 3.

FIG. 6 is a timing diagram for illustrating an example of a read operation of a semiconductor device in accordance with an embodiment of the present invention. For example, FIG. 6 illustrates the read operation in a case when "low (0)" data has been stored in the selected memory cell of the semiconductor device 100.

Referring to FIG. 6, a selected word line WL# of the plurality of word lines WL0~WLm may be enabled, a selected bit line BL# of the plurality of bit lines BL0, BLn and the global bit line GBL may be coupled together, and a selected source line SL# of the plurality of source lines SL0~SLn and the global source line GSL may be coupled together. In this case, the selected word line WL# may be enabled at a first point of time, the selected bit line BL# and the global bit line GBL may be coupled together at a second point of time, and the selected source line SL# and the global source line GSL may be coupled together at the second point of time. The first point of time and the second point of time may be the same, or the first point of time may be earlier than the second point of time, or the second point of time may be earlier than the first point of time. When the selected word line WL# is enabled, the selected bit line BL# and the global bit line GBL are coupled together, and the selected source line SL# and the global source line GSL are coupled together, any one of the plurality of memory cells MC may be selected. The selected memory cell may have one end coupled to the global bit line GBL and the other end coupled to the global source line GSL. The selected memory cell may couple the global bit line GBL and the global source line GSL together when the selected word line WL# is enabled.

The sense enable signal SEN may be activated after a scheduled time (e.g., D3) since the read enable signal REN is activated at a point of time similar to the first point of time. The read circuit 140 of FIG. 3 may generate differential read data SO and SOB, corresponding to a read current IRD flowing through the selected memory cell, in response to the read enable signal REN and the sense enable signal SEN. For example, the read current source unit RS1 may source the read current IRD from the sense amplification unit S/A to the global bit line GBL in response to the read enable signal REN. The read current sink unit RS2 may sink the read current IRD from the global source line GSL to the low voltage stage VSS in response to the read enable signal REN. In this case, the maximum amount of current of the read current IRD may be limited by the clamp unit RC. In such a case, the read current IRD may flow in one direction. For example, the read current IRD may flow from the sense amplification unit S/A to the read current sink unit RS2 via the read current source unit RS1, the clamp unit RC, the global bit line GBL, the selected bit line BL#, the selected memory cell, the selected source line SL# and the global source line GSL. The reference current generation unit IS may generate a reference current IREF. The reference current source unit RS3 may source the reference current IREF from the sense amplification unit S/A to the reference current generation unit IS in response to the read enable signal REN. The sense amplification unit S/A may compare the read current IRD with the reference current IREF, and may generate differential read data SO and SOB corresponding to a result of the comparison. For example, the read current IRD may be higher than the reference current IREF because the selected memory cell is at the low resistance state. Accordingly, the sense amplification unit S/A may generate the positive read data SO having a "low (0)" logic value and the negative read data SOB having a "high (1)" logic value, which correspond to the low resistance state.

At this time, the selected memory cell may switch from the low resistance state to the high resistance state because the read current IRD flows in the first direction through the selected memory cell. This may be called read disturbance. That is, "high (1)" data may be stored in the selected memory cell because a weak write operation is performed on the selected memory cell due to the read current IRD flowing in the first direction upon the read operation. The reason why the "weak" write operation is expressed is that the read current may be smaller than a write current flowing into the selected memory cell upon a write operation. Accordingly, if a memory cell that belongs to the plurality of memory cells MC and that has the low resistance state is selected and the read operation is performed on the selected memory cell, the following reverse read operation may be performed as part of the read operation.

The reverse read control circuit 150 may generate a reverse read control signal REV_RD and an inverted reverse read control signal REV_RDB based on the read enable signal REN and the differential read data SO and SOB. For example, the reverse read control circuit 150 may activate the reverse read control signal REV_RD and the inverted reverse read control signal REV_RDB based on the differential read data SO and SOB corresponding to the low resistance state. In this case, the reverse read control signal REV_RD and the inverted reverse read control signal REV_RDB may be activated after the read enable signal REN is deactivated or after the sense amplification unit S/A is disabled. In this case, the width (i.e., D3) in which the reverse read control signal REV_RD is activated and the width in which the inverted reverse read control signal REV_RDB is activated may be smaller than the width in which the read enable signal REN is activated. The inverted reverse read control signal REV_RDB may be an inverted signal of the reverse read control signal REV_RD.

The reverse current generation circuit 160 may be coupled to the global bit line GBL and the global source line GSL based on the activated reverse read control signal REV_RD and inverted reverse read control signal REV_RDB, and may generate a reverse current flowing in the other direction through the selected memory cell. For example, the reverse current source unit RRS1 may source the reverse current from the high voltage stage VDD to the global source line GSL in response to the inverted reverse read control signal REV_RDB. In this case, a maximum amount of current of the reverse current may be limited by the clamp unit RRC. The reverse current may have the amount of current identical with or similar to a read current IRD when the selected memory cell is at the low resistance state. The reverse current sink unit RRS2 may sink the reverse current from the global bit line GBL to the low voltage stage VSS. In such a case, the reverse current may flow from the high voltage stage VDD to the low voltage stage VSS via the reverse current source unit RRS1, the clamp unit RRC, the global source line GSL, the selected source line SL#, the selected memory cell, the selected bit line BL#, the global bit line GBL and the reverse current sink unit RRS2.

Accordingly, although the selected memory cell switches from the low resistance state to the high resistance state due to the read operation, the selected memory cell can be restored to the low resistance state by performing the reverse read operation.

Figure 7:
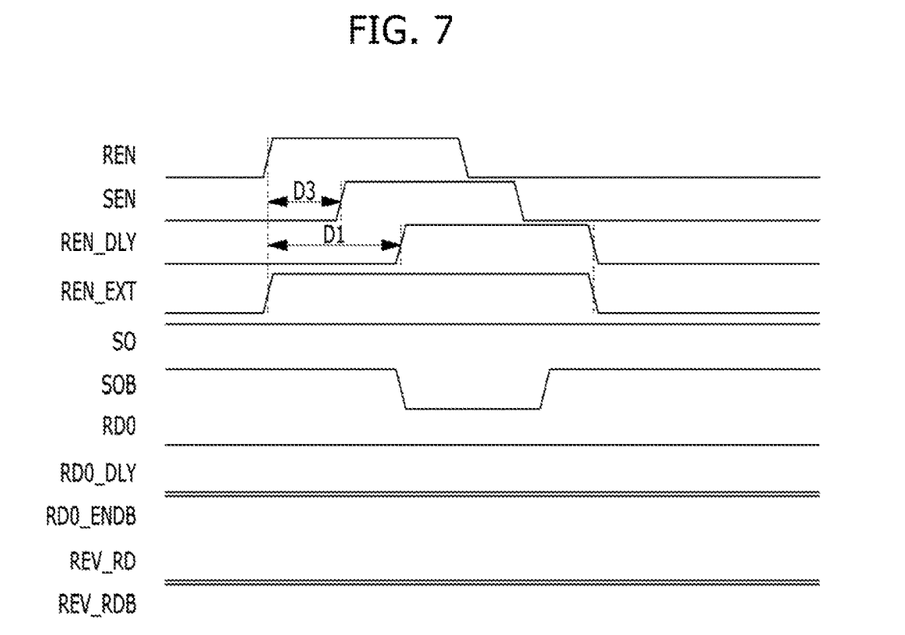

FIG. 7 is a timing diagram for illustrating an example of a read operation of a semiconductor device in accordance with an embodiment of the present invention. For example, FIG. 7 illustrates the read operation in a case when "high (1)" data has been stored in the selected memory cell of the semiconductor device.

Referring to FIG. 7, a selected word line WL# of the plurality of word lines WL0~WLm may be enabled at a first point of time, a selected bit line BL# of the plurality of bit lines BL0~BLn and the global bit line GBL may be coupled together at a second point of time, and a selected source line SL# of the plurality of source lines SL0~SLn and the global source line GSL may be coupled together at the second point of time. When the selected word line WL# is enabled, the selected bit line BL# and the global bit line GBL are coupled together, and the selected source line SL# and the global source line GSL are coupled together, any one of the plurality of memory cells MC may be selected. The selected memory cell may have one end coupled to the global bit line GBL and the other end coupled to the global source line GSL. The selected memory cell may couple the global bit line GBL and the global source line GSL together when the selected word line WL# is enabled.

The sense enable signal SEN may be activated after a scheduled time (e.g., D3) since the read enable signal REN is activated at a point of time similar to the first point of time. The read circuit 140 may generate differential read data SO and SOB, corresponding to a read current IRD flowing through the selected memory cell, in response to the read enable signal REN and the sense enable signal SEN. For example, the read current source unit RS1 may source the read current IRD from the sense amplification unit S/A to the global bit line GBL in response to the read enable signal REN. The read current sink unit RS2 may sink the read current IRD from the global source line GSL to the low voltage stage VSS in response to the read enable signal REN. In this case, a maximum amount of current of the read current IRD may be limited by the clamp unit RC. In such a case, the read current IRD may flow in a first direction. For example, the read current IRD may flow from the sense amplification unit S/A to the read current sink unit RS2 via the read current source unit RS1, the clamp unit RC, the global bit line GBL, the selected bit line BL#, the selected memory cell, the selected source line SL# and the global source line GSL. The reference current generation unit IS may generate a reference current IREF. The reference current source unit RS3 may source the reference current IREF from the sense amplification unit S/A to the reference current generation unit IS in response to the read enable signal REN. The sense amplification unit S/A may compare the read current IRD with the reference current IREF, and may generate differential read data SO and SOB corresponding to a result of the comparison. For example, the read current IRD may be lower than the reference current IREF because the selected memory cell is at the high resistance state. Accordingly, the sense amplification unit S/A may generate the positive read data SO having a "high (1)" logic value and the negative read data SOB having a "low (0)" logic value, which correspond to the high resistance state.

At this time, the selected memory cell may maintain the high resistance state because the read current IRD may flow in the first direction through the selected memory cell. That is, the "high (1)" data stored in the selected memory cell can be retained because a weak write operation is performed on the selected memory cell by the read current IRD upon the read operation. Accordingly, if a memory cell that belongs to the plurality of memory cells MC and that is at the high resistance state is selected and the read operation is performed on the selected memory cell, the reverse read operation does not need to be performed.

A read operation of the semiconductor device 100 including the reverse read control circuit 150 of FIG. 5 will be described below with reference to FIGS. 8 and 9.

Figure 8:
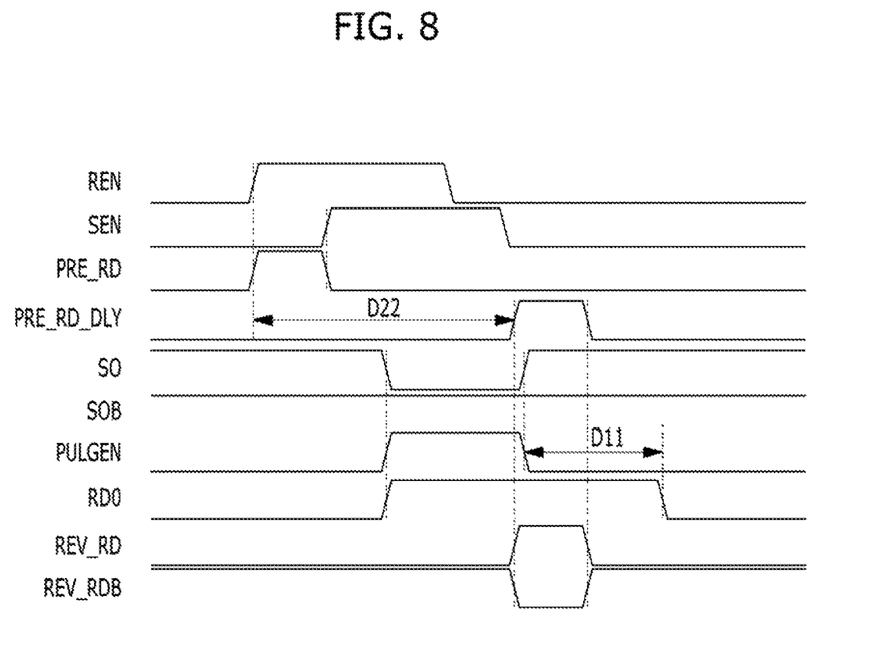

FIG. 8 is a timing diagram for illustrating an example of a read operation of a semiconductor device in accordance with an embodiment of the present invention. For example, FIG. 8 illustrates the read operation in case that "low (0)" data has been stored in the selected memory cell of the semiconductor device 100. FIG. 9 is a timing diagram for illustrating an example of a read operation of a semiconductor device in accordance with an embodiment of the present invention. For example, FIG. 9 illustrates the read operation in a case when "high (1)" data has been stored in the selected memory cell of the semiconductor device 100.

Figure 9:
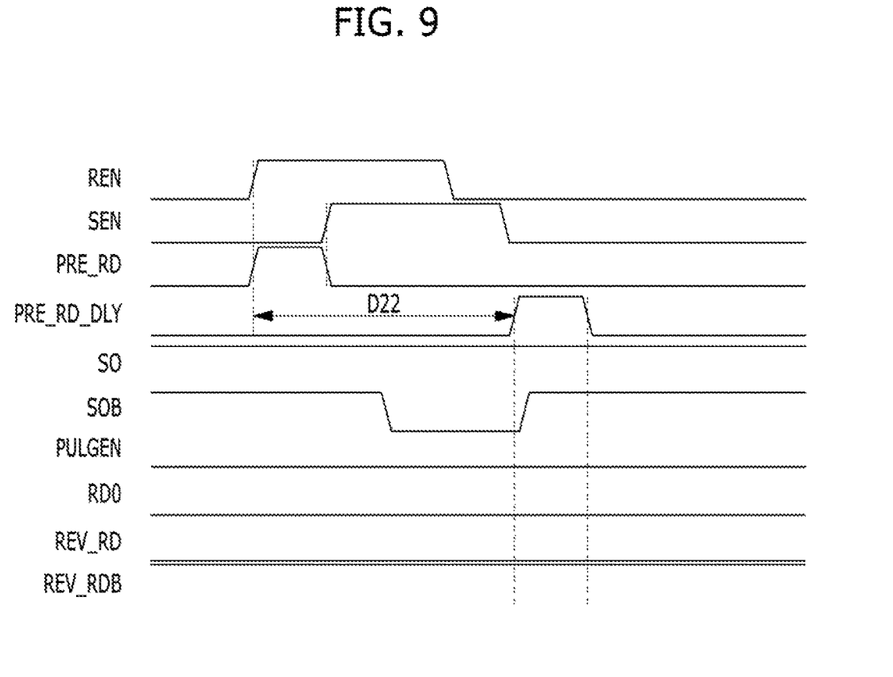

The read operations of FIGS. 8 and 9 are generally similar to those of FIGS. 6 and 7 except for the combinations of signals for generating the reverse read control signal REV_RD and the inverted reverse read control signal REV_RDB. Thus, a detailed description thereof is omitted.

In accordance with an embodiment of the present invention, there are advantages in that the read disturbance can be prevented through a reverse read operation. The reverse read operation can be selectively performed depending on a resistance state of the selected memory cell upon the read operation. Furthermore, there is an advantage in that a consumption current, an operating time and the lifespan of a memory cell can be improved compared to a write back method for generating the reverse current using the write circuit.

An embodiment of the present invention is directed to an improved semiconductor memory device exhibiting improved operational reliability by preventing read disturbance upon a read operation.

The present invention semiconductor memory device is advantageous over existing devices employing conventional write back technology.

Although various embodiments have been described for illustrative purposes, it will be apparent to those skilled in the art that various changes and modifications may be made without departing from the spirit and scope of the invention as defined in the following claims.

What is claimed is:

1. A semiconductor device, comprising:
a memory cell array including a plurality of memory cells;
a read circuit suitable for generating read data corresponding to a read current flowing in a first direction through a selected memory cell of the plurality of memory cells;
a reverse read control circuit suitable for generating a reverse read control signal corresponding to a data value of the read data by performing a logical operation on at least one of a sense enable signal, a read enable signal and the read data; and
a reverse current generation circuit suitable for generating a reverse current flowing in a second direction through the selected memory cell in response to the reverse read control signal,
wherein the reverse read control circuit comprises:
a determination unit suitable for generating a first determination signal corresponding to a resistance state of the selected memory cell by performing a logical operation on the read enable signal and the read data, or generating a second determination signal corresponding to a resistance state of the selected memory cell by performing a logical operation on the read data; and
a control unit suitable for generating the reverse read control signal by performing a logical operation on the first determination signal, or generating the reverse read control signal by performing a logical operation on the read enable signal, the sense enable signal and the second determination signal.

2. The semiconductor device of claim 1, wherein the reverse read control circuit is suitable for:
activating the reverse read control signal based on the read data having a first data value; and
deactivating the reverse read control signal based on the read data having a second data value.

3. The semiconductor device of claim 2, wherein:
the first data value corresponds to the read current flowing when the selected memory cell is a low resistance state, and
the second data value corresponds to the read current flowing when the selected memory cell is a high resistance state.

4. The semiconductor device of claim 1,
wherein the read circuit comprises:
a sense amplification unit suitable for generating the read data based on the read current and a reference current, and enabled in response to the sense enable signal;
a read current source unit suitable for sourcing the read current from the sense amplification unit to the global bit line in response to the read enable signal; and
a read current sink unit suitable for sinking the read current from the global source line to the low voltage stage in response to the read enable signal.

5. The semiconductor device of claim 1, wherein the reverse current generation circuit is suitable for:
   generating the reverse current in response to the reverse read control signal which is activated, and
   not generating the reverse current in response to the reverse read control signal which is deactivated.

6. The semiconductor device of claim 1, wherein the reverse current generation circuit comprises:
   a reverse current source unit suitable for sourcing the reverse current in response to the reverse read control signal; and
   a reverse current sink unit suitable for sinking the reverse current in response to the reverse read control signal.

7. The semiconductor device of claim 6, wherein the reverse current generation circuit further comprises a clamping unit suitable for limiting the reverse current.

8. The semiconductor device of claim 1, wherein each of the plurality of memory cells comprises a variable resistance element having a resistance state varied depending on a direction of the read current.

9. The semiconductor device of claim 1, further comprising a write circuit suitable for generating a write current flowing in a direction corresponding to write data through a selected memory cell of the plurality of memory cells.

10. A semiconductor device, comprising:
    a global bit line;
    a global source line;
    a plurality of bit lines coupled to the global bit line;
    a plurality of source lines coupled to the global source line;
    a memory cell array including a plurality of memory cells arranged in a row direction and column direction, wherein memory cells belonging to the plurality of memory cells and being aligned in the row direction are selected by a plurality of word lines and memory cells belonging to the plurality of memory cells and being aligned in the column direction are selected by the plurality of bit lines and the plurality of source lines;
    a read circuit coupled to the global bit line, suitable for generating read data corresponding to a read current flowing in a first direction through a selected memory cell of the plurality of memory cells;
    a reverse read control circuit suitable for generating a reverse read control signal corresponding to a data value of the read data by performing a logical operation on at least one of a sense enable signal, a read enable signal and the read data; and
    a reverse current generation circuit coupled to the global bit line and the global source line in response to the reverse read control signal, suitable for generating a reverse current flowing in a second direction through the selected memory cell,
    wherein the reverse read control circuit comprises:
    a determination unit suitable for generating a first determination signal corresponding to a resistance state of the selected memory cell by performing a logical operation on the read enable signal and the read data, or generating a second determination signal corresponding to a resistance state of the selected memory cell by performing a logical operation on the read data; and
    a control unit suitable for generating the reverse read control signal by performing a logical operation on the first determination signal, or generating the reverse read control signal by performing a logical operation on the read enable signal, the sense enable signal and the second determination signal.

11. The semiconductor device of claim 10, wherein the reverse read control circuit is suitable for:
    activating the reverse read control signal based on the read data having a first data value; and
    deactivating the reverse read control signal based on the read data having a second data value.

12. The semiconductor device of claim 11, wherein:
    the first data value corresponds to the read current flowing when the selected memory cell is a low resistance state, and
    the second data value corresponds to the read current flowing when the selected memory cell is a high resistance state.

13. The semiconductor device of claim 10, wherein the reverse current generation circuit is suitable for:
    generating the reverse current in response to the reverse read control signal which is activated, and
    not generating the reverse current in response to the reverse read control signal which is deactivated.

14. The semiconductor device of claim 10, wherein the reverse current generation circuit comprises:
    a reverse current sink unit suitable for sinking the reverse current from the global bit line to a low voltage stage in response to the reverse read control signal; and
    a reverse current source unit suitable for sourcing the reverse current from a high voltage stage to the global source line in response to an inverted signal of the reverse read control signal.

15. The semiconductor device of claim 14, wherein the reverse current generation circuit further comprises a clamp unit suitable for being coupled between the reverse current source unit and the global source line and for limiting the reverse current.

16. The semiconductor device of claim 10, wherein the read circuit comprises:
    a sense amplification unit suitable for generating the read data based on the read current and a reference current, and enabled in response to the sense enable signal;
    a read current source unit suitable for sourcing the read current from the sense amplification unit to the global bit line in response to the read enable signal; and
    a read current sink unit suitable for sinking the read current from the global source line to the low voltage stage in response to the read enable signal.

17. The semiconductor device of claim 16, wherein the read circuit further comprises a clamp unit suitable for being coupled between the read current source unit and the global bit line and limiting the read current.

18. The semiconductor device of claim 10, wherein each of the plurality of memory cells comprises a variable resistance element having a resistance state varied depending on a direction of the read current.

19. The semiconductor device of claim 10, further comprising a write circuit coupled between the global bit line and the global source line, suitable for generating a write current flowing in a direction corresponding to write data through a selected memory cell of the plurality of memory cells.

* * * * *